United States Patent
Hsu et al.

(10) Patent No.: US 12,387,960 B2
(45) Date of Patent: Aug. 12, 2025

(54) CARRIER PLATE APPLIED FOR LOAD PORT

(71) Applicant: Brillian Network & Automation Integrated System Co., Ltd., Miaoli County (TW)

(72) Inventors: Sheng-Chi Hsu, Miaoli County (TW); Yi-Chun Gu, Miaoli County (TW); Han-Cheng Hu, Miaoli County (TW)

(73) Assignee: BRILLIAN NETWORK & AUTOMATION INTEGRATED SYSTEM CO., LTD., Miaoli County (TW)

( * ) Notice: Subject to any disclaimer, the term of this patent is extended or adjusted under 35 U.S.C. 154(b) by 496 days.

(21) Appl. No.: 18/076,237

(22) Filed: Dec. 6, 2022

(65) Prior Publication Data

US 2023/0207360 A1    Jun. 29, 2023

(30) Foreign Application Priority Data

Dec. 28, 2021 (TW) .................... 110215509
May 10, 2022 (TW) .................... 111117493

(51) Int. Cl.
   *B05B 1/26*    (2006.01)
   *H01L 21/673*  (2006.01)

(52) U.S. Cl.
   CPC ............... *H01L 21/67389* (2013.01)

(58) Field of Classification Search
   CPC ............ H01L 21/67389; H01L 21/677; H01L 21/6838
   See application file for complete search history.

(56) References Cited

U.S. PATENT DOCUMENTS

| | | | |
|---|---|---|---|
| 11,779,940 B1* | 10/2023 | Kwon | H01L 21/67288 239/11 |
| 2013/0326841 A1* | 12/2013 | Natsume | H01L 21/67393 15/405 |
| 2021/0291236 A1* | 9/2021 | Matsushita | B08B 5/02 |

* cited by examiner

*Primary Examiner* — Amy J. Sterling
(74) *Attorney, Agent, or Firm* — MUNCY, GEISSLER, OLDS & LOWE, P.C.

(57) ABSTRACT

A carrier plate applied for a load port is provided, which includes a first guide slot is provided with a first switch to drive a first nozzle to move up and down to switch the position, a second guide slot is provided with a second switch to drive a second nozzle to move up and down to switch the position, a third guide slot is provided with a third switch to drive a third nozzle to move obliquely to switch the position, and a fourth guide slot is provided with a fourth nozzle to move obliquely to switch the position, thereby, the first nozzle, the second nozzle, the third nozzle and the fourth nozzle move to the positions corresponding to the air holes on each of the bottoms of the wafer transfer cassettes to inflate or exhaust the wafer transfer cassette.

8 Claims, 6 Drawing Sheets

CARRIER PLATE APPLIED FOR LOAD PORT

CROSS-REFERENCE TO RELATED APPLICATIONS

This application claims the benefit of TW 111117493, filed May 10, 2022, and TW 110215509, filed Dec. 28, 2021, which is incorporated in its entirety by reference herein.

FIELD OF THE INVENTION

The present invention relates to a carrier plate applied for load port, particularly relates to a carrier plate which can switch the position of the nozzle according to the types of different wafer transfer cassette.

BACKGROUND OF THE INVENTION

In recent years, the high integration of wafers or the miniaturization of circuits have developed rapidly, and the environmental requirements have been improved. When exposed to atmosphere, moisture or oxygen tends to adhere to the surface of wafer, and there is a possibility of corrosion or oxidation. Therefore, it is necessary to maintain the microenvironment around the wafer at a high cleanliness to avoid the occurrence of particles or moisture adhering to the wafer surface. The current effective method is to make the periphery of the wafer surrounded by inert gas environment such as nitrogen, the periphery of wafer be in a vacuum state, or surrounded by dry air to avoid the changes in surface properties such as wafer surface oxidation.

In order to properly maintain a microenvironment around the wafer, the wafer is placed and managed inside a closed wafer transfer cassette which is filled with nitrogen gas or dry air.

In recent years, there is no unified standard specification between manufacturers and different types of wafer transfer cassettes, and the positions of inlet and outlet holes are different. The various types of wafer transfer cassettes need to be prepared to match with different specifications of carrier plates, resulting in inconvenient operation and higher cost.

Therefore, to design a carrier plate with high compatibility with different types of wafer transfer cassettes for effectively improving operation efficiency and saving equipment cost becomes an important issue.

SUMMARY OF THE INVENTION

To solve the problems of the prior art, the main object of the present invention is to provide a carrier plate applied for load port. Only one carrier plate is required, and the positions of the nozzles on the carrier plate can be adjusted to correspond to various types of wafer transfer cassettes, which reduces the cost of designing different carrier plates required to match various types of wafer transfer cassettes, and the convenience of the wafer factory in use may be increased. Thus, the problem of storage space for accommodating the plurality of carrier plates for the wafer factory may be solved.

Another object of the present invention is that the nozzles on the carrier plate can switch the positions which corresponding the arrangement of the air holes on each of the bottoms of the wafer transfer cassettes, so that the purge gas can inflate or exhaust the wafer transfer cassette through the nozzles after switching nozzles' positions.

According to the above objects, the present invention provides a carrier plate applied for load port. The carrier plate includes a main body, which is arranged on a load port. The main body of the carrier plate includes a first guide slot, a second guide slot, a third guide slot and the fourth guide slot. The first guide slot is arranged on the lower side of the main body. The first guide slot is provided with a first switch and a first nozzle, and the first switch drives the first nozzle to move up and down to switch the position of the first nozzle. The second guide slot is arranged on the lower side of the main body opposite the first guide slot. The second guide slot is provided with a second switch and a second nozzle, and the second switch drives the second nozzle to move up and down to switch the position of the second nozzle. The third guide slot is arranged on the upper side of the main body opposite the first guide slot. The third guide slot is provided with a third switch and a third nozzle, and the third switch drives the third nozzle to move obliquely to switch the position of the third nozzle. The fourth guide slot is arranged on the upper side of the main body opposite the third guide slot. The fourth slot is provided with a fourth switch and a fourth nozzle, and the fourth switch drives the fourth nozzle to move obliquely to switch the position. The first nozzle, the second nozzle, the third nozzle, and the fourth nozzle move to the positions corresponding the plurality of air holes on a bottom of the wafer transfer cassette to inflate or exhaust the wafer transfer cassette.

In one preferred embodiment of the invention, the carrier plate applied for load port further includes a fifth nozzle and a sixth nozzle, which are respectively arranged on the upper side of the main body, and the distance between the fifth nozzle and the sixth nozzle is smaller than that of between the third nozzle and the fourth nozzle.

In one preferred embodiment of the present invention, when the first nozzle is switched to the upper position of the first guide slot, the second nozzle is switched to the upper position of the second guide slot, the third nozzle is located at the outermost position of the third guide slot and the fourth nozzle is located at the outermost position of the fourth guide slot, in which there is a first distance between the center of the first nozzle hole of the first nozzle and the center of the second nozzle hole of the second nozzle, there is a second distance between the center of the third nozzle hole of the third nozzle and the center of the fourth nozzle hole of the fourth nozzle, and the second distance is larger than the first distance.

In one preferred embodiment of the present invention, when the first nozzle is switched to the upper position of the first guide slot, the second nozzle is switched to the upper position of the second guide slot, the third nozzle is located at the uppermost position of the third guide slot and the fourth nozzle is located at the uppermost position of the fourth guide slot, in which there is a third distance between the center of the third nozzle hole and the center of the fourth nozzle hole of the third nozzle, and the third distance is smaller than the second distance and larger than the first distance.

In one preferred embodiment of the present invention, when the first nozzle is switched to the lower position of the first guide slot, the second nozzle is switched to the lower position of the second guide slot, the third nozzle is located at the innermost position of the third guide slot and the fourth nozzle is located at the innermost position of the fourth guide slot, in which there is a first distance between the center of the first nozzle hole of the first nozzle and the center of the second nozzle hole of the second nozzle, and there is a fourth distance between the center of the third nozzle hole of the third nozzle and the center of the fourth nozzle hole of the fourth nozzle, and the fourth distance is smaller than the third distance and equal to the first distance.

In one preferred embodiment of the present invention, when the first nozzle is switched to the lower position of the first guide slot and the second nozzle is switched to the lower position of the second guide slot, there is a first distance between the center of the first nozzle hole of the first nozzle and the center of the second nozzle hole of the second nozzle, and there is a fifth distance between the center of the fifth nozzle hole of the fifth nozzle and the center of the sixth nozzle hole of the sixth nozzle, and the fifth distance is equal to the first distance.

DETAILED DESCRIPTION OF THE PREFERRED EMBODIMENT

Figure 1:
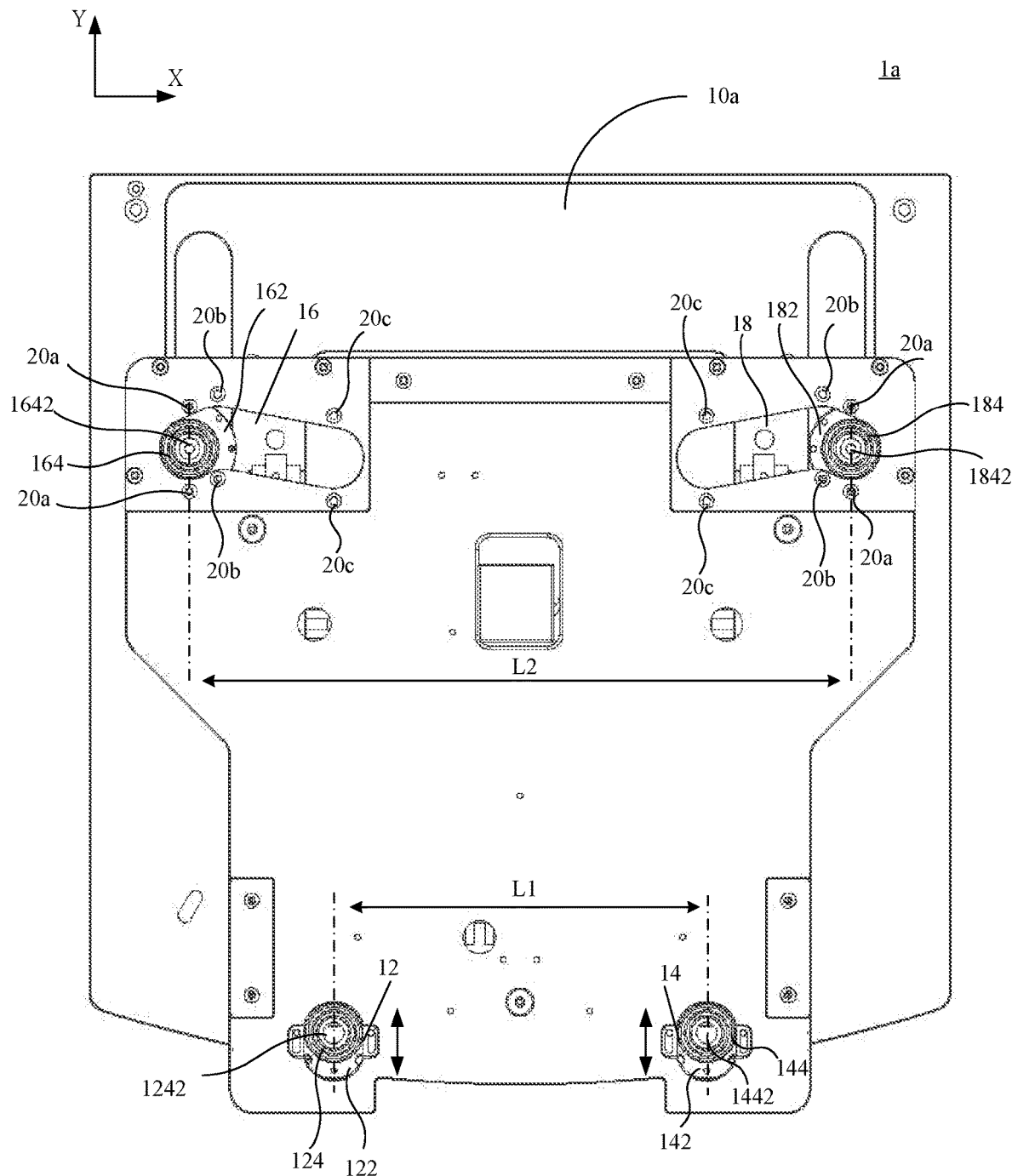
FIG. 1 is a schematic diagram showing a first embodiment of a carrier plate applied for a load port in accordance with the present invention disclosed herein.

Please Refer to FIG. 1. FIG. 1 is a schematic diagram showing a first embodiment of a carrier plate applied for a load port. In FIG. 1, the carrier plate 1a has a main body 10a, which is arranged on the load port (not shown). In addition, in FIG. 1, the upper and lower sides of the main body 10a are represented by the Y direction of the Cartesian coordinate system, and the left and right sides of the main body 10a are represented by the X direction. The main body 10a of the carrier plate 1a includes a first guide slot 12, a second guide slot 14, a third guide slot 16 and a fourth guide slot 18, and the structure and positional relationship of above components of the carrier plate 1a are described in detail as follows.

The first guide slot 12 is arranged on the lower side of the main body 10a. The first guide slot 12 is provided with a first switch 122 and a first nozzle 124. The first switch 122 drives the first nozzle 124 to move up and down to switch the position of the first nozzle 124 in the first guide slot 12. The second guide slot 14 is arranged on the lower side of the main body 10 opposite the first guide slot 12. The second guide slot 14 is provided with a second switch 142 and a second nozzle 144. The second switch 142 drives the second nozzle 144 to move up and down to switch the position of the second nozzle 144 in the second guide slot 14. It should be noted that the first guide slot 12 and the second guide slot 14 are respectively arranged on the left and right sides of the lower side of the main body 10a. The included angle between the direction in which the first nozzle 124 moves up and down and the X direction is 90 degrees, and the included angle between the direction in which the second nozzle 144 moves up and down and the X direction is 90 degrees. The third guide slot 16 is arranged on the upper side of the main body 10 opposite the first guide slot 12. The third guide slot 16 is provided with a third switch 162 and a third nozzle 164. The third switch 162 drives the third nozzle 164 to move obliquely to switch the position of the third nozzle 164. The fourth guide slot 18 is arranged on the upper side of the main body 10a opposite the third guide slot 16. The fourth guide slot 18 is provided with a fourth switch 182 and a fourth nozzle 184. The fourth switch 182 drives the fourth nozzle 184 to move obliquely to switch the position of the fourth nozzle 184. The included angle between the direction in which the third nozzle 164 moves obliquely and the X direction is between 10 degrees and 35 degrees, and the included angle between the direction in which the fourth nozzle 184 move obliquely and the X direction is also between 10 degrees and 35 degrees. It is further explained that the third guide slot 16 and the fourth guide slot 18 are respectively arranged above the first guide slot 12 and the second guide slot 14. In addition, at least three positioning points 20a, 20b and 20c are respectively defined outside the third guide slot 16 and the fourth guide slot 18, each positioning points 20a, 20b and 20c corresponds to the positions of the plurality of air holes on each of the bottoms of different types of wafer transfer cassettes (not shown). Accordingly, the third switch 162 can drive the third nozzle 164 to switch to one of the positioning points 20a, 20b or 20c in the third guide slot 16. The fourth switch 182 can drive the fourth nozzle 184 to switch to one of the positioning points 20a, 20b or 20c in the fourth guide slot 18. According to the above, according to the positions (not shown) of the plurality of air holes on each of the bottoms (not shown) of the wafer transfer cassettes (not shown), the first switch 122 drives the first nozzle 124, the second switch 142 drives the second nozzle 144, the third switch 162 drives the third nozzle 164 and the fourth switch 182 drives the fourth nozzle 184 to move to switch the positions, so the positions of the nozzles after switching can correspond to the positions of the plurality of air holes (not shown) on each of the bottoms (not shown) of different types of wafer transfer cassettes (not shown) and inflate or exhaust the wafer transfer cassette (not shown). That is, the position arrangement of the plurality of air holes on each of the bottoms of the different types of wafer transfer cassettes (not shown) may also be different. The carrier plate 1a of the present invention can compatible with at least three kinds of wafer transfer cassettes with different air hole arrangement by switching the positions of the nozzles. It will be illustrated as follows.

In FIG. 1, when the carrier plate 1a carries the first wafer transfer cassette (not shown) thereon, in order to correspond to the arrangement of positions of the plurality of air holes on the bottom of the first wafer transfer cassette (not shown), the first nozzle 124 of the carrier plate 1a is switched to the upper position of the first guide slot 12, the second nozzle 144 is switched to the upper position of the second guide slot 14, and the third nozzle 164 is located at the outermost position of the third guide slot 16 (positioning point 20a), the fourth nozzle 184 is located at the outermost position (positioning point 20a) of the fourth guide slot 18, in which there is a first distance L1 between the center of the first nozzle hole 1242 of the first nozzle 124 and the center of the second nozzle hole 1442 of the second nozzle 144, a second distance L2 between the center of the third nozzle hole 1642 of the third nozzle 164 and the center of the fourth nozzle hole 1842 of the fourth nozzle 184. Accordingly, the second distance L2 is larger than the first distance L1.

Figure 2:
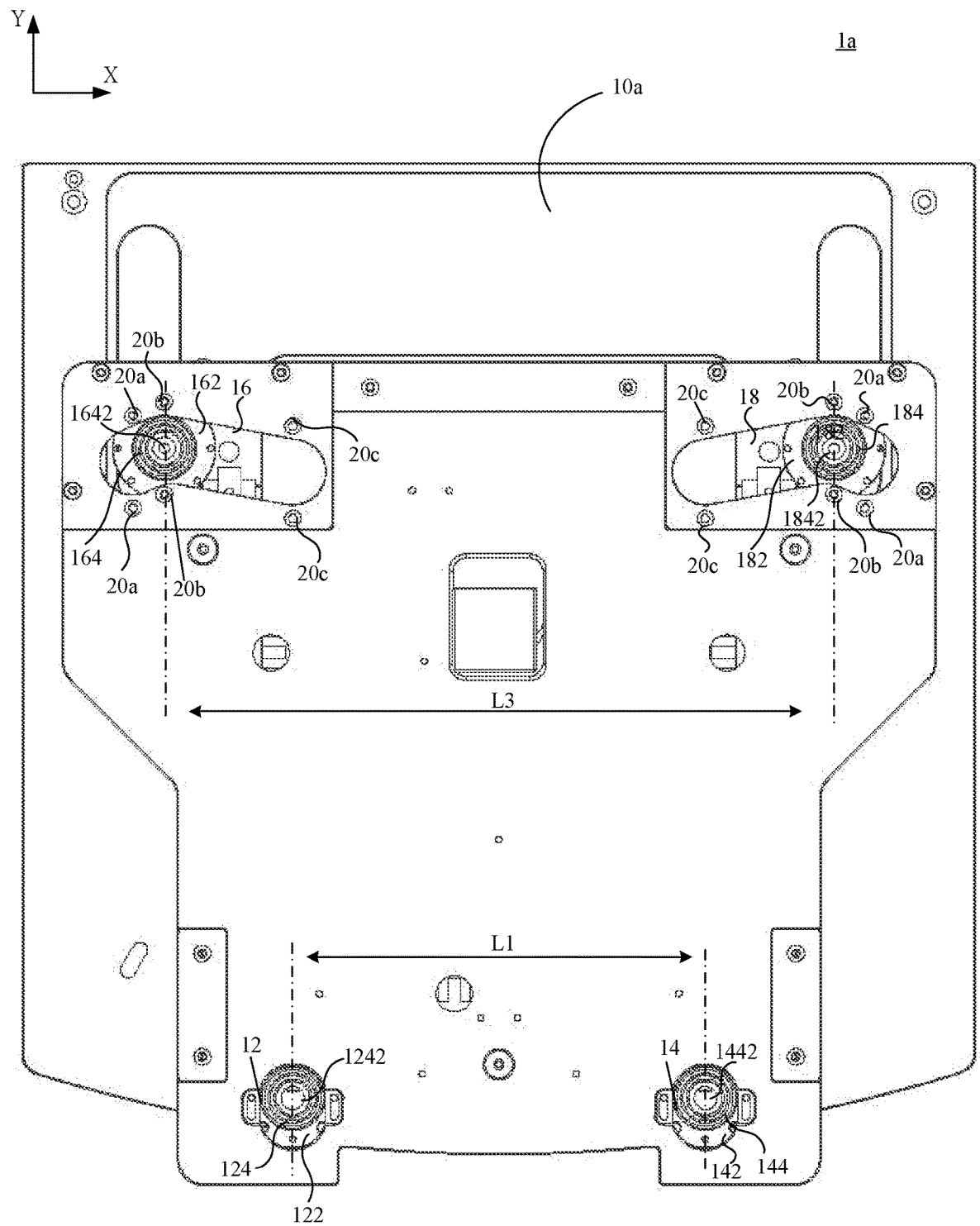
FIG. 2 is a schematic diagram showing a second embodiment of a carrier plate applied for a load port in accordance with the present invention disclosed herein.

Please refer to FIG. 2. FIG. 2 is a schematic diagram of the second embodiment of carrier plate applied for a load port. The structure and position relationship of the first guide slot 12, the second guide slot 14, the third guide slot 16 and the fourth guide slot 18 of the main body 10*a* of the carrier plate 1*a* in FIG. 2 are the same as those of in FIG. 1. Accordingly, the structure and position relationship of above components of the carrier plate 1*a* are not described repeatedly. As shown in FIG. 2, when the carrier plate 1*a* carries the second wafer transfer cassette (not shown), in order to correspond to the arrangements of positions of the plurality of air holes on the bottom of the second wafer transfer cassette (not shown), the first nozzle 124 of the carrier plate 1*a* is switched to the upper position of the first guide slot 12, and the second nozzle 144 is switched to the upper position of the second guide slot 14, and the third nozzle 164 is located at the uppermost position of the third guide slot 16 (positioning point 20*b*), and the fourth nozzle 184 is located at the uppermost position (positioning point 20*b*) of the fourth guide slot 18, in which there is a third distance L3 between the center of the third nozzle hole 1642 of the third nozzle 164 and the center of the fourth nozzle hole 1842 of the fourth nozzle 184. Accordingly, the third distance L3 is smaller than the second distance L2 (as shown in FIG. 1) and larger than the first distance L1.

Figure 3:
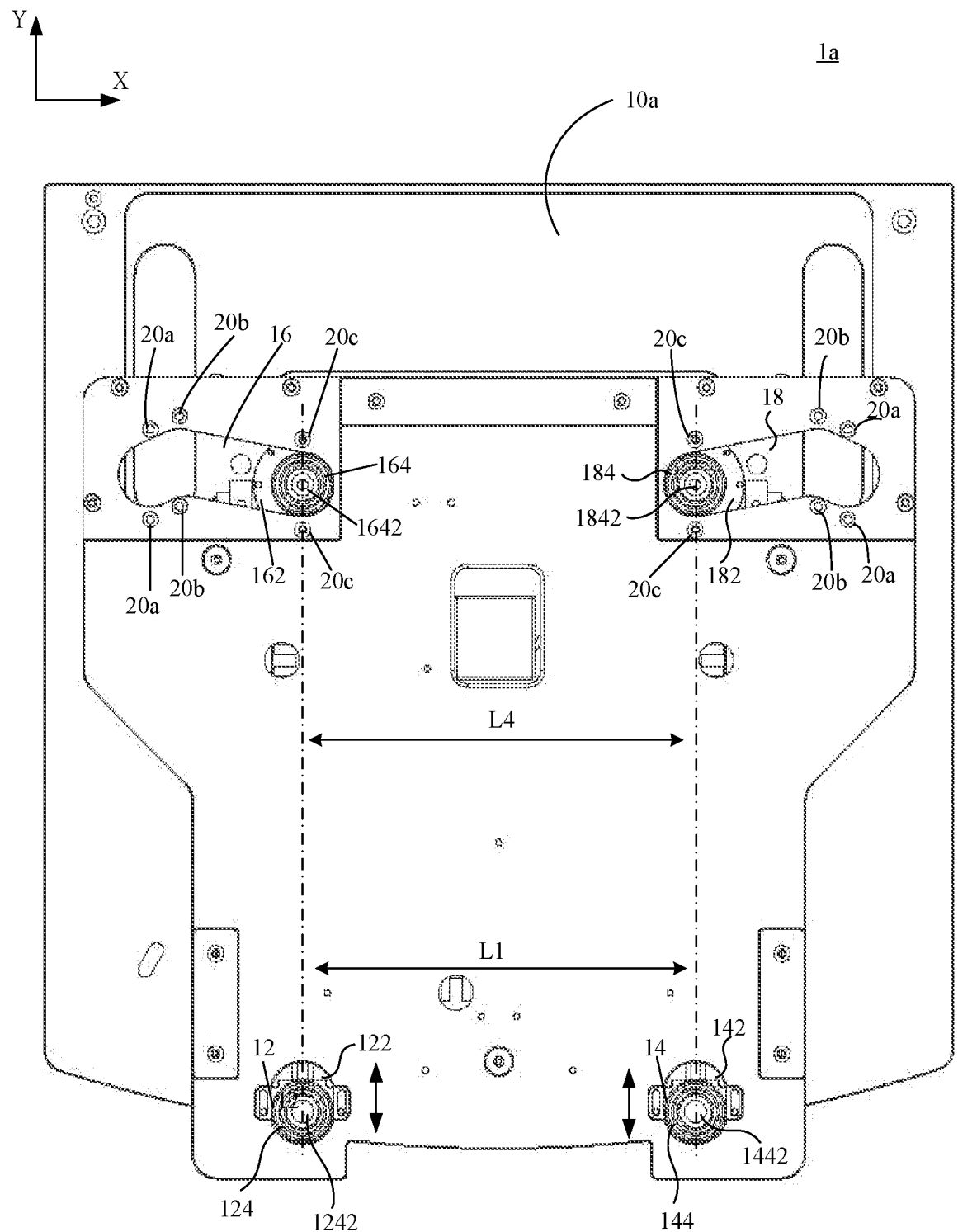
FIG. 3 is a schematic diagram showing a third embodiment of a carrier plate applied for a load port in accordance with the present invention disclosed herein.

Please refer to FIG. 3. FIG. 3 is a schematic diagram showing a third embodiment of the carrier plate applied for a load port. Similarly, the structure and position relationship of the first guide slot 12, the second guide slot 14, the third guide slot 16 and the fourth guide slot 18 of the main body 10*a* of the carrier plate 1*a* in FIG. 3 are the same as that of in FIG. 1. Accordingly, the structure and position relationship of above components of the carrier plate 1*a* are not described repeatedly. As shown in FIG. 3, when the carrier plate 1*a* carries the third wafer transfer cassette (not shown), in order to correspond to the arrangement of the positions of the plurality of air holes on the bottom of the third wafer transfer cassette (not shown), the first nozzle 124 of the carrier plate 1*a* is switched to the lower position of the first guide slot 12, and the second nozzle 144 is switched to the lower position of the second guide slot 14, and the third nozzle 164 is located at the innermost position (positioning point 20*c*) of the third guide slot 16, and the fourth nozzle 184 is located at the innermost position (positioning point 20*c*) of the fourth guide slot 18, in which there is a fourth distance L4 between the center of the third nozzle hole 1642 of the third nozzle 164 and the center of the fourth nozzle hole 1842 of the fourth nozzle 184. Accordingly, the fourth distance L4 is smaller than the third distance L3 (as shown in FIG. 2) and equal to the first distance L1.

Figure 4:
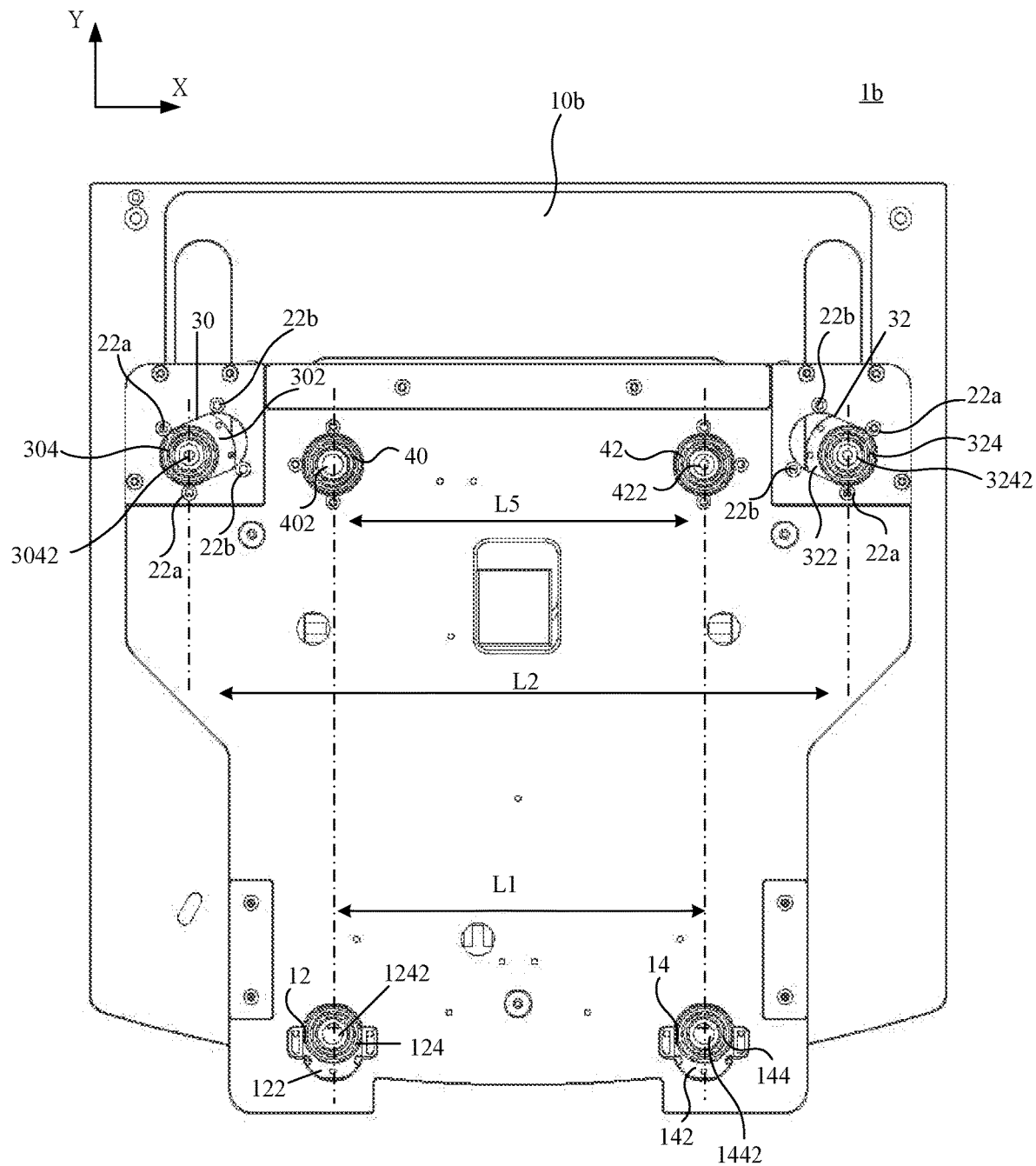
FIG. 4 is a schematic diagram showing a fourth embodiment of a carrier plate applied for a load port in accordance with the present invention disclosed herein.

Please refer to FIG. 4. FIG. 4 is a schematic diagram showing a fourth embodiment of the carrier plate applied for a load port. In FIG. 4, the carrier plate 1*b* has a main body 10*b*, which is arranged on the wafer transfer cassette (not shown). Further, in FIG. 4, the upper and lower sides of the main body 10*b* are represented by the Y direction of the Cartesian coordinate system, and the left and right sides of the main body 10*b* are represented by the X direction. The main body 10*b* of the carrier plate 1*b* includes a first guide slot 12, a second guide slot 14, a third guide slot 30 and a fourth guide slot 32. The structure and position relationship are described as follows.

The first guide slot 12 is arranged on the lower side of the main body 10*b*, and the first switch 122 and the first nozzle 124 are arranged in the first guide slot 12. The first switch 122 drives the first nozzle 124 to move up and down to switch the position of the first nozzle 124 in the first guide slot 12. The second guide slot 14 is arranged on the lower side of the main body 10*b* opposite the first guide slot 12. The second guide slot 14 is provided with a second switch 142 and a second nozzle 144. The second switch 142 drives the second nozzle 144 to move up and down to switch the position of the second nozzle 144 in the second guide slot 14. It should be noted that the first guide slot 12 and the second guide slot 14 are respectively arranged on the left and right sides of the lower side of the main body 10*b*. The third guide slot 30 is arranged on the upper side of the main body 10*b* opposite the first guide slot 12. The third guide slot 30 is provided with a third switch 302 and a third nozzle 304. The third switch 302 drives the third nozzle 304 to move obliquely to switch the position of the third nozzle 304. The fourth guide slot 32 is arranged on the upper side of the main body 10*b* opposite the third guide slot 30. The fourth guide slot 32 is provided with a fourth switch 322 and a fourth nozzle 324. The fourth switch 322 drives the fourth nozzle 324 to move obliquely to switch the position of the fourth nozzle 324. In addition, at least two positioning points 22*a* and 22*b* are defined outside the third guide slot 30 and the fourth guide slot 32, and the positioning points 22*a* and 22*b* corresponds to the positions of the air holes on each of the bottoms of different types of wafer transfer cassettes (not shown). Accordingly, the third switch 302 may drive the third nozzle 304 to switch to one of the positioning points 22*a* or 22*b* in the third guide slot 30. The fourth switch 322 can drive the fourth nozzle 324 to switch to one of the positioning points 22*a* or 22*b* in the fourth guide slot 32. In this embodiment, the fifth nozzle 40 and the sixth nozzle 42 are respectively arranged on the upper side of the main body 10*b*. Accordingly, the fifth distance L5 between the center of the fifth nozzle hole 402 of the fifth nozzle 40 and the center of the sixth nozzle hole 422 of the sixth nozzle 42 is smaller than the second distance L2, but equal to the first distance L1.

In FIG. 4, when the carrier plate 1*b* carries the first wafer transfer cassette (not shown), in order to correspond to the arrangement of air holes on the bottom of the first wafer transfer cassette (not shown), the first nozzle 124 of the carrier plate 1*b* is switched to the upper position of the first guide slot 12, the second nozzle 144 is switched to the upper position of the second guide slot 14, and the third nozzle 304 of the third guide slot 30 and the fourth nozzle 324 of the fourth guide slot 32 are at the position of the positioning point 22*a*, the third nozzle 304 is located at the outermost position of the third guide slot 30 (positioning point 22*a*), and the fourth nozzle 32 is located at the outermost position of the fourth guide slot 32 (positioning point 22*a*). Accordingly, there is a first distance L1 between the center of the first nozzle hole 1242 of the first nozzle 124 and the center of the second nozzle hole 1442 of the second nozzle 144, and there is a fifth distance L5 between the fifth nozzle 40 and the sixth nozzle 42, and the first distance L1 is equal to the fifth distance L5. There is a second distance L2 between the center of the third nozzle hole 3042 of the third nozzle 304 and the center of the fourth nozzle hole 3242 of the fourth nozzle 324, so that the second distance L2 is larger than the first distance L1 and larger than the fifth distance L5.

According to the above, according to the position of a plurality of air holes (not shown) on the bottom (not shown) of the first wafer transfer cassette (not shown), the first switch 122 drives the first nozzle 124, the second switch 142 drives the second nozzle 144, the third switch 302 drives the third nozzle 304 to switch to the outermost position of the third guide slot 30 (positioning point 22a) and the fourth switch 322 drives the fourth nozzle 324 to switch to the outermost position of the fourth guide slot 18 (positioning point 22a), so that the positions of the nozzles after switching can correspond to positions of the plurality of air holes (not shown) of the wafer transfer cassette (not shown) and inflate or exhaust the first wafer transfer cassette (not shown).

Figure 5:
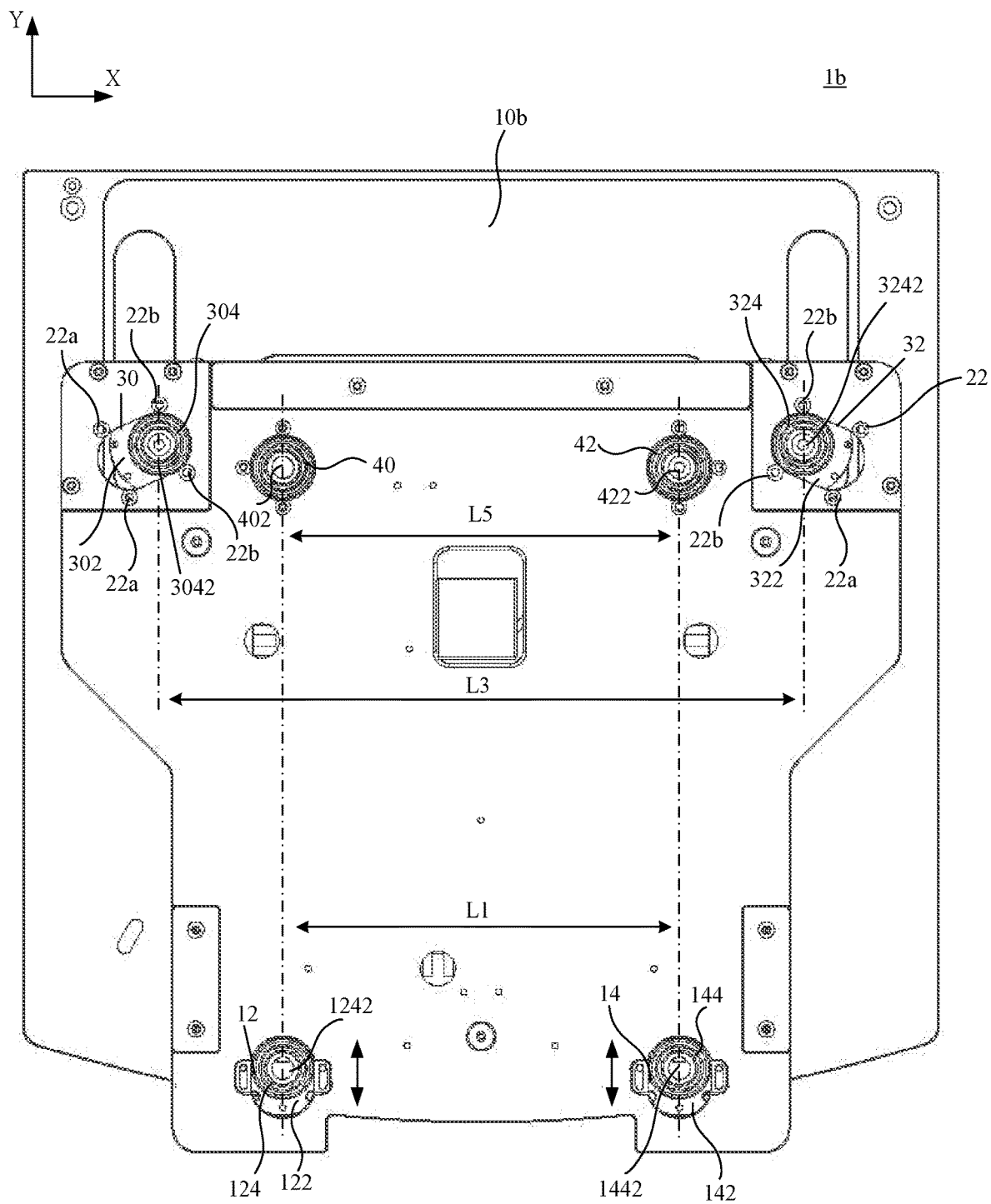
FIG. 5 is a schematic diagram showing a fifth embodiment of a carrier plate applied for a load port in accordance with the present invention disclosed herein.

Next, please refer to FIG. 5. FIG. 5 is a schematic diagram showing a fifth embodiment of a carrier plate applied for a load port. The structure and position relationship of the first guide slot 12, the second guide slot 14, the third guide slot 30 and the fourth guide slot 32 of the main body 10b of the carrier plate 1b in FIG. 5 are the same as that of in FIG. 4. Accordingly, the structure and position relationship of above components of the carrier plate 1b are not described repeatedly. In FIG. 5, when the carrier plate 1b carries the second wafer transfer cassette (not shown) thereon, in order to correspond to the arrangement of plurality of air holes on the bottom of the second wafer transfer cassette (not shown), the first nozzle 124 of the carrier plate 1b is switched to the upper position of the first guide slot 12, the second nozzle 144 is switched to the upper position of the second guide slot 14, and the third nozzle 304 is located at the uppermost position of the third guide slot 30 (positioning point 22b), the fourth nozzle 32 is located at the uppermost position of the fourth guide slot 30 (positioning point 22b), in which there is a first distance L1 between the center of the first nozzle hole 1242 of the first nozzle 124 and the center of the second nozzle hole 1442 of the second nozzle 144, and there is a fifth distance L5 between the center of the fifth nozzle hole 402 of the fifth nozzle 40 and the center of the sixth nozzle hole 422 of the sixth nozzle 42, so that the first distance L1 is equal to the fifth distance L5. Accordingly, there is a third distance L3 between the center of the third nozzle hole 3042 of the third nozzle 304 and the center of the fourth nozzle hole 3242 of the fourth nozzle 324, in which the third distance L3 is smaller than the second distance L2 but larger than the first distance L1 and larger than the fifth distance L5.

Figure 6:
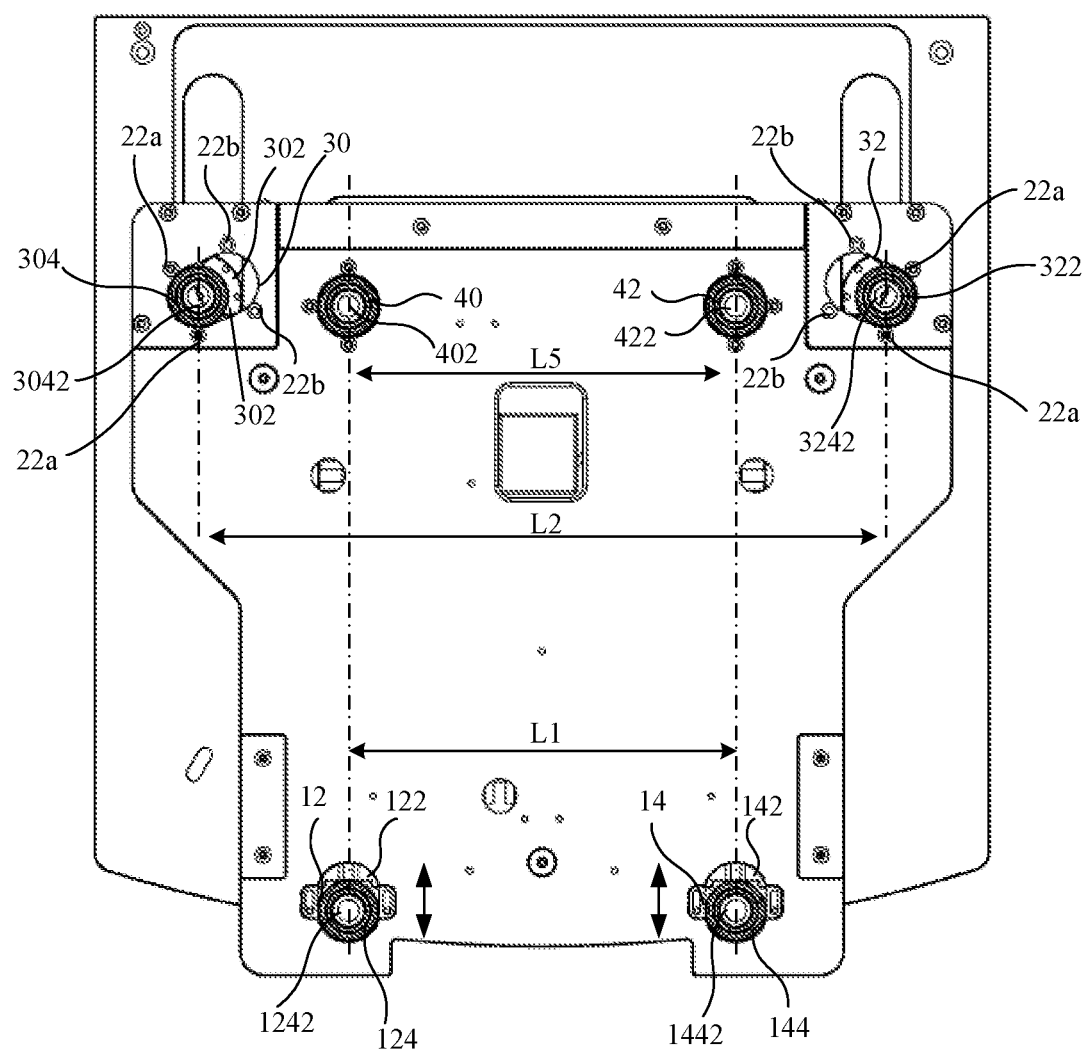
FIG. 6 is a schematic diagram showing a sixth embodiment of a carrier plate applied for a load port in accordance with the present invention disclosed herein.

Next, please refer to FIG. 6. FIG. 6 is a schematic diagram showing a sixth embodiment of a carrier plate applied for a load port. Similarly, the structure and position relationship of the first guide slot 12, the second guide slot 14, the third guide slot 30 and the fourth guide slot 32 of the main body 10b of the carrier plate 1b in FIG. 6 are the same as that of in FIG. 4. Accordingly, the structure and position relationship of above components of the carrier plate 1b are not described repeatedly. In FIG. 6, when the carrier plate 1b carries the third wafer transfer cassette (not shown), in order to correspond to the arrangement of the positions of the plurality of air holes on the bottom of the third wafer transfer cassette (not shown), the first nozzle 124 of the carrier plate 1b is switched to the lower side of the first guide slot 12, the second nozzle 144 is switched to the lower side of the second guide slot 14, and the third nozzle 304 can be located at any position in the third guide slot 30, such as the outermost position (positioning point 22a). The fourth nozzle 32 can also be located at any position in the fourth guide slot 30, such as the outermost position (positioning point 22a), in which there is a first distance L1 between the center of the first nozzle hole 1242 of the first nozzle 124 and the center of the second nozzle hole 1442 of the second nozzle 144, a fifth distance L5 between the center of the fifth nozzle hole 402 of the fifth nozzle 40 and the center of the sixth nozzle hole 422 of the sixth nozzle 42, and the first distance L1 is equal to the fifth distance L5. There is a second distance L2 between the center of the third nozzle hole 3042 of the third nozzle 304 and the center of the fourth nozzle hole 3242 of the fourth nozzle 324. Accordingly, the second distance L2 is larger than the first distance L1 and larger than the fifth distance L5.

In the foregoing embodiments, the first nozzle 124 and the second nozzle 144 are usually used to inflate the wafer transfer cassette (not shown), and the third nozzle 164, the fourth nozzle 184, the fifth nozzle 40 and the sixth nozzle hole 422 are usually used to exhaust the wafer transfer cassette (not shown). In another embodiment, the third nozzle 164 may be used to inflate the wafer transfer cassette (not shown), and the fourth nozzle 184 may be used to exhaust the wafer transfer cassette (not shown). It is not to limit the inflation or exhaust function of each nozzle in this invention, as long as the positions of the nozzles can correspond to various types of wafer transfer cassettes (not shown).

According to the above, the user only needs to adjust the first nozzle 124, the second nozzle 144, the third nozzle 164 and the fourth nozzle 184 of the carrier plate 1a, and the first nozzle 124, the second nozzle 144, the third nozzle 304 and the fourth nozzle 324 of the carrier plate 1b according to the corresponding positions of the plurality of air holes (not shown) on each of the bottoms (not shown) of the wafer transfer cassettes (not shown). Accordingly, the carrier plate 1a or 1b increases the convenience of use and reduces the cost of using different carrier plates at the bottom of the different wafer transfer cassette (not shown) and increase the storage space availability of the wafer fab.

What is claimed is:

1. A carrier plate applied for a load port, comprising:
   a main body arranged on the load port;
   a first guide slot arranged on the lower side of the main body and provided with a first switch and a first nozzle, wherein the first switch drives the first nozzle to move up and down to switch the position of the first nozzle;
   a second guide slot arranged on the lower side of the main body opposite the first guide slot and provided with a second switch and a second nozzle, wherein the second switch drives the second nozzle to move up and down to switch the position of the second nozzle;
   a third guide slot arranged on the upper side of the main body opposite the first guide slot and provided with a third switch and a third nozzle,
   wherein the third switch drives the third nozzle to move obliquely to switch the position of the third nozzle; and
   a fourth guide slot arranged on the upper side of the main body opposite the third guide slot and provided with a fourth switch and a fourth nozzle, wherein the fourth switch drives the fourth nozzle to move obliquely to switch the position of the fourth nozzle,
   wherein, the first nozzle, the second nozzle, the third nozzle, and the fourth nozzle move to correspond the positions of a plurality of air holes on each of the bottoms of a plurality of wafer transfer cassettes to inflate or exhaust the wafer transfer cassettes.

2. The carrier plate applied for the load port according to claim 1, further comprising a fifth nozzle and a sixth nozzle, which are respectively arranged on the upper side of the main body, wherein the distance between the fifth nozzle and the sixth nozzle is smaller than the distance between the third nozzle and the fourth nozzle.

3. The carrier plate applied for the load port according to claim 2, wherein when the first nozzle is switched to the upper position of the first guide slot, the second nozzle is switched to the upper position of the second guide slot, the third nozzle is located at the outermost position of the third guide slot, and the fourth nozzle is located at the outermost position of the fourth guide slot, so that there is a first distance between the center of a first nozzle hole of the first nozzle and the center of a second nozzle hole of the second nozzle and a second distance between the center of a third nozzle hole of the third nozzle and the center of a fourth nozzle hole of the fourth nozzle, wherein the second distance is larger than the first distance.

4. The carrier plate applied for the load port according to claim 2, wherein when the first nozzle is switched to the upper position of the first guide slot, the second nozzle is switched to the upper position of the second guide slot, the third nozzle is located at the uppermost position of the third guide slot and the fourth nozzle is located at the uppermost position of the fourth guide slot, so that there is a first distance between the center of a first nozzle hole of the first nozzle and the center of a second nozzle hole of the second nozzle and a third distance between the center of a third nozzle hole of the third nozzle and the center of a fourth nozzle hole of the fourth nozzle, wherein the third distance is larger than the first distance.

5. The carrier plate applied for the load port according to claim 2, wherein when the first nozzle is switched to the lower position of the first guide slot and the second nozzle is switched to the lower position of the second guide slot, so that there is a first distance between the center of a first nozzle hole of the first nozzle and the center of a second nozzle hole of the second nozzle and a fifth distance between the center of a fifth nozzle hole of the fifth nozzle and the center of a sixth nozzle hole of the sixth nozzle, wherein the fifth distance is equal to the first distance.

6. The carrier plate applied for the load port according to claim 1, wherein when the first nozzle is switched to the upper position of the first guide slot, the second nozzle is switched to the upper position of the second guide slot, the third nozzle is located at the outermost position of the third guide slot, and the fourth nozzle is located at the outermost position of the fourth guide slot, so that there is a first distance between the center of a first nozzle hole of the first nozzle and the center of a second nozzle hole of the second nozzle and a second distance between the center of a third nozzle hole of the third nozzle and the center of a fourth nozzle hole of the fourth nozzle, wherein the second distance is larger than the first distance.

7. The carrier plate applied for the load port according to claim 1, wherein when the first nozzle is switched to the upper position of the first guide slot and the second nozzle is switched to the upper position of the second guide slot, the third nozzle is located at the uppermost position of the third guide slot and the fourth nozzle is located at the uppermost position of the fourth guide slot, so that there is a third distance between the center of a third nozzle hole of the third nozzle and the center of a fourth nozzle hole of the fourth nozzle, wherein the third distance is larger than the first distance.

8. The carrier plate applied for the load port according to claim 1, wherein when the first nozzle is switched to the lower position of the first guide slot, the second nozzle is switched to the lower position of the second guide slot, the third nozzle is located at the innermost position of the third guide slot and the fourth nozzle is located at the innermost position of the fourth guide slot, so that there is a first distance between the center of a first nozzle hole of the first nozzle and the center of a second nozzle hole of the second nozzle and a fourth distance between the center of a third nozzle hole of the third nozzle and the center of a fourth nozzle hole of the fourth nozzle, wherein the fourth distance is equal to the first distance.

* * * * *